US008429811B2

(12) United States Patent
Endo

(10) Patent No.: US 8,429,811 B2
(45) Date of Patent: Apr. 30, 2013

(54) TOOL REPLACEMENT METHOD FOR TANDEM PRESS SYSTEM AND TANDEM PRESS SYSTEM

(75) Inventor: Kenichi Endo, Machida (JP)

(73) Assignee: AIDA Engineering, Ltd., Kanagawa (JP)

( * ) Notice: Subject to any disclaimer, the term of this patent is extended or adjusted under 35 U.S.C. 154(b) by 253 days.

(21) Appl. No.: 12/966,271

(22) Filed: Dec. 13, 2010

(65) Prior Publication Data

US 2012/0144639 A1 Jun. 14, 2012

(51) Int. Cl.
*H05K 3/30* (2006.01)

(52) U.S. Cl.
USPC ........................................................ 29/823

(58) Field of Classification Search ............... 29/402.08, 29/402.01, 402.02, 33 R, 564, 564.1, 564.2, 29/700, 721, 242, 823, 824, 759, 760; 100/207, 100/405.09
See application file for complete search history.

(56) References Cited

U.S. PATENT DOCUMENTS

| | | | |
|---|---|---|---|
| 5,012,665 | A | 5/1991 | Brandstetter |
| 5,140,839 | A | 8/1992 | Bruns |
| 6,786,857 | B2 | 9/2004 | Harsch et al. |

FOREIGN PATENT DOCUMENTS

| | | | |
|---|---|---|---|
| DE | 42 01 387 | A1 | 7/1993 |
| EP | 0 388 610 | A1 | 9/1990 |
| JP | 6-034820 | U | 5/1994 |
| JP | 7-124665 | A | 5/1995 |
| JP | 11-057897 | A | 3/1999 |
| JP | 2000 343160 | A | 12/2000 |
| JP | 2004-50290 | A | 2/2004 |
| JP | 2005-161379 | A | 6/2005 |
| JP | 2006-272455 | A | 10/2006 |
| JP | 2009-023268 | A | 2/2009 |

OTHER PUBLICATIONS

Japanese Office Action with English Translation issued in Japanese Appl. No. 2009-203569 mailed Nov. 21, 2012.

*Primary Examiner* — John C Hong
(74) *Attorney, Agent, or Firm* — McDermott Will & Emery LLP

(57) ABSTRACT

A tandem press system includes a plurality of presses disposed in a workpiece transfer direction, a workpiece transfer device that transfers a workpiece from an upstream press to a downstream press using a tool mounted on the workpiece transfer device via a crossbar, and a tool replacement device that replaces the tool mounted on the workpiece transfer device. The tool replacement device can be transferred from an inter-press space between the upstream press and the downstream press to an external space in a tool replacement direction independently of transfer of a bolster provided with a die to an external space in a die replacement direction.

7 Claims, 5 Drawing Sheets

TOOL REPLACEMENT METHOD FOR TANDEM PRESS SYSTEM AND TANDEM PRESS SYSTEM

BACKGROUND OF THE INVENTION

The present invention relates to a tandem press system that is configured so that a workpiece can be transferred from an upstream press to a downstream press disposed in a workpiece transfer direction using a workpiece transfer device, and a tool mounted on the workpiece transfer device can be replaced using a tool replacement device, and a tool replacement method.

A tandem press system that includes a plurality of presses disposed in a workpiece transfer direction processes a workpiece using each press while transferring the workpiece from the upstream press to the downstream press using a workpiece transfer device. The workpiece transfer device holds the workpiece using a tool. The tool is generally a unit formed by disposing a workpiece holding means (e.g., a plurality of vacuum suction cups) depending on the shape and the weight of the workpiece. The tool is removably mounted on the workpiece transfer device via a crossbar. Specifically, the tool is mounted on or removed from the workpiece transfer device (coupling/holding section) by mounting or removing the crossbar on or from the coupling/holding section of the workpiece transfer device.

It is necessary to replace a die when changing the press target product (product). The shape, the size, and the weight of the workpiece (material) may also change. In this case, it is necessary to replace the tool of the workpiece transfer device that has been used for the current press operation (hereinafter referred to as “current tool”) with a tool that is used for the subsequent press operation (hereinafter referred to as “subsequent tool”). A tool replacement device is used to replace the crossbar mounted with the current tool (hereinafter referred to as “current crossbar”) with the crossbar mounted with the subsequent tool (hereinafter referred to as “subsequent crossbar”). The tool replacement operation includes replacing the current crossbar with the subsequent crossbar mounted with the subsequent tool outside the press system. Note that the current tool may be removed from the current crossbar, and the subsequent tool may be mounted on the current crossbar.

A synchronous transfer-type tool replacement device that is synchronized with die transfer (related-art example 1) (e.g., JP-A-2004-50290), and an independent transfer-type tool replacement device (related-art example 2) (e.g., JP-A-2005-161379) have been known.

In the related-art example 1, a tool replacement device (12) that includes a rotary lever is rotatably mounted on a slide table (bolster). The tool replacement device (12) is transferred to the external space in synchronization with transfer of a bolster for die replacement. Specifically, the rotary lever is pulled upright, and the current crossbar is received. The tool replacement device is moved toward the bolster, and the bolster is transferred to the external space. Specifically, the current die and the current crossbar are transferred in synchronization.

The die that has been used for the current press operation (hereinafter referred to as “current die”) is replaced with a die that is used for the subsequent press operation (hereinafter referred to as “subsequent die”) in the external space, and the current crossbar is replaced with the subsequent crossbar. The subsequent crossbar is then transferred in synchronization with transfer of the bolster (die) into the press. The rotary lever is then pulled apart from the bolster, and the subsequent crossbar is delivered to the workpiece transfer device (coupling/holding section). The rotary lever is then rotated into a horizontal state.

JP-A-2004-50290 states that this tool replacement device does not hinder access to the press. However, since it is necessary to always support the tool replacement device 12 (e.g., rotary lever) in a horizontal state, it is difficult to employ the related-art example 1 for a tandem press system in which the pitch (inter-press pitch) between the upstream press and the downstream press is small.

In the related-art example 2, a truck is provided on a rail (r1, r2) that extends from the inter-press space to the external space, and a receiving stage (3) that receives a crossbar (cb) is mounted on the truck (1). In order to prevent staggering or a tilt when the truck has a small width and a large height, the position (posture) of the truck (receiving stage) with respect to the rail is stabilized by utilizing a plurality of rollers (r01, r02, r03). JP-A-2005-161379 states that the inter-press transfer device can smoothly transfer the crossbar (cb) to the external space even if the inter-press pitch is small.

JP-A-2005-161379 does not disclose the relationship with a workpiece transfer device, a crossbar replacement operation, and a die replacement operation. It is conjectured that a tool bar is replaced as follows using the inter-press transfer device. Specifically, the inter-press transfer device (receiving stage (truck)) in an empty state is transferred from the external space to the inter-press space, and the current crossbar is delivered to the receiving stage from the workpiece transfer device. The inter-press transfer device is then transferred to the external space. The current crossbar is removed, from the receiving stage in the external space, and the subsequent crossbar is mounted on the receiving stage. The inter-press transfer device is then transferred from the external space to the inter-press space, and the subsequent crossbar is delivered to the workpiece transfer device in an empty state. The inter-press transfer device is then transferred to the external space.

The related-art example 1 aims at facilitating access to the press, and the related-art example 2 aims at dealing with a small inter-press space pitch. However, the related-art examples 1 and 2 are silent about an improvement in productivity of the entire tandem press system and implementation of a quick tool replacement operation. Specifically, the related-art examples 1 and 2 are not aware of, or do not suggest, the following problems.

Productivity is improved by implementing a quick tool replacement operation. In the related-art example 1, since the die replacement operation and the tool replacement operation are sequentially performed in time series, it is difficult to promote implement a quick tool replacement operation due to the relationship with the die replacement operation. Since it is necessary to move the rotary lever (replacement device 12) relative to the bolster (table), the tool replacement operation takes time. The rotation operation also increases the tool replacement time. Moreover, since the press side space (side opening) becomes narrow, productivity is not improved even if access to the press is facilitated. Since the rotary lever (replacement device 12) is transferred to the external space together with the bolster, the die replacement operation in the external space and the subsequent tool replacement operation take time the operations become difficult) due to the mechanical configuration. Moreover, the tool cannot be replaced without replacing the die.

According to the related-art example 2 (i.e., linear travel example), the transfer speed can be relatively increased as compared with the related-art example 1 (rotation and linear travel of the heavy bolster). However, the truck (receiving stage) must be caused to make two round trips between the external space and the inter-press space in order to replace the tool. Moreover, the subsequent crossbar cannot be mounted without removing the current crossbar from the inter-press transfer device (receiving stage). This makes the operation complex, and a mistake may easily occur. Therefore, the tool replacement time increases.

SUMMARY

According to a first aspect of the invention, there is provided a tool replacement method for a tandem press system that is configured so that a workpiece can be transferred from an upstream press to a downstream press disposed in a workpiece transfer direction using a workpiece transfer device, and a tool mounted on the workpiece transfer device can be replaced using a tool replacement device, the method including:

mounting a subsequent crossbar mounted with a subsequent tool on one of receiving sections of the tool replacement device in an external space in a tool replacement direction that perpendicularly intersects the workpiece transfer direction;

transferring the tool replacement device mounted with the subsequent crossbar from the external space to an inter-press space between the upstream press and the downstream press during a press suspension period;

delivering a current crossbar mounted with a current tool from the workpiece transfer device to empty one of the receiving sections of the tool replacement device in the inter-press space;

delivering the subsequent crossbar mounted on the one of the receiving sections to the workpiece transfer device; and transferring the tool replacement device mounted with the current crossbar delivered from the workpiece transfer device to the external space to complete a replacement operation of the tool mounted on the workpiece transfer device.

According to a second aspect of the invention, there is provided a tandem press system including:

a plurality of presses disposed in a workpiece transfer direction;

a workpiece transfer device that transfers a workpiece from an upstream press to a downstream press using a tool mounted on the workpiece transfer device via a crossbar; and a tool replacement device that replaces the tool mounted on the workpiece transfer device, wherein the tool replacement device can be transferred from an inter-press space between the upstream press and the downstream press to an external space in a tool replacement direction that perpendicularly intersects the workpiece transfer direction independently of transfer of a bolster provided with a die to an external space in a die replacement direction that perpendicularly intersects the workpiece transfer direction;

wherein two receiving sections disposed in parallel in the workpiece transfer direction are provided in a crossbar mounting section of the tool replacement device, and two crossbars can be respectively mounted on the two receiving sections at the same time;

wherein a current crossbar mounted with a current tool can be delivered from the workpiece transfer device to empty one of the receiving sections of the tool replacement device in the inter-press space during a press suspension period, and a subsequent crossbar mounted with a subsequent tool can be delivered, to the workpiece transfer device from one of the receiving sections of the tool replacement device; and wherein the tool replacement device that has received the current crossbar can be transferred to the external space in the tool replacement direction, and the current crossbar can be removed from one of the receiving sections in the external space, and the subsequent crossbar can be mounted on the other of the receiving sections.

BRIEF DESCRIPTION OF THE SEVERAL VIEWS OF THE DRAWING

FIG. 2A illustrates a tool replacement operation in an external space, and FIG. 2B illustrates a subsequent crossbar delivery operation in an inter-press space.

FIG. 3A is a plan view and FIG. 3B is a partial cross-sectional side view.

DETAILED DESCRIPTION OF THE EMBODIMENT

Figure 1:
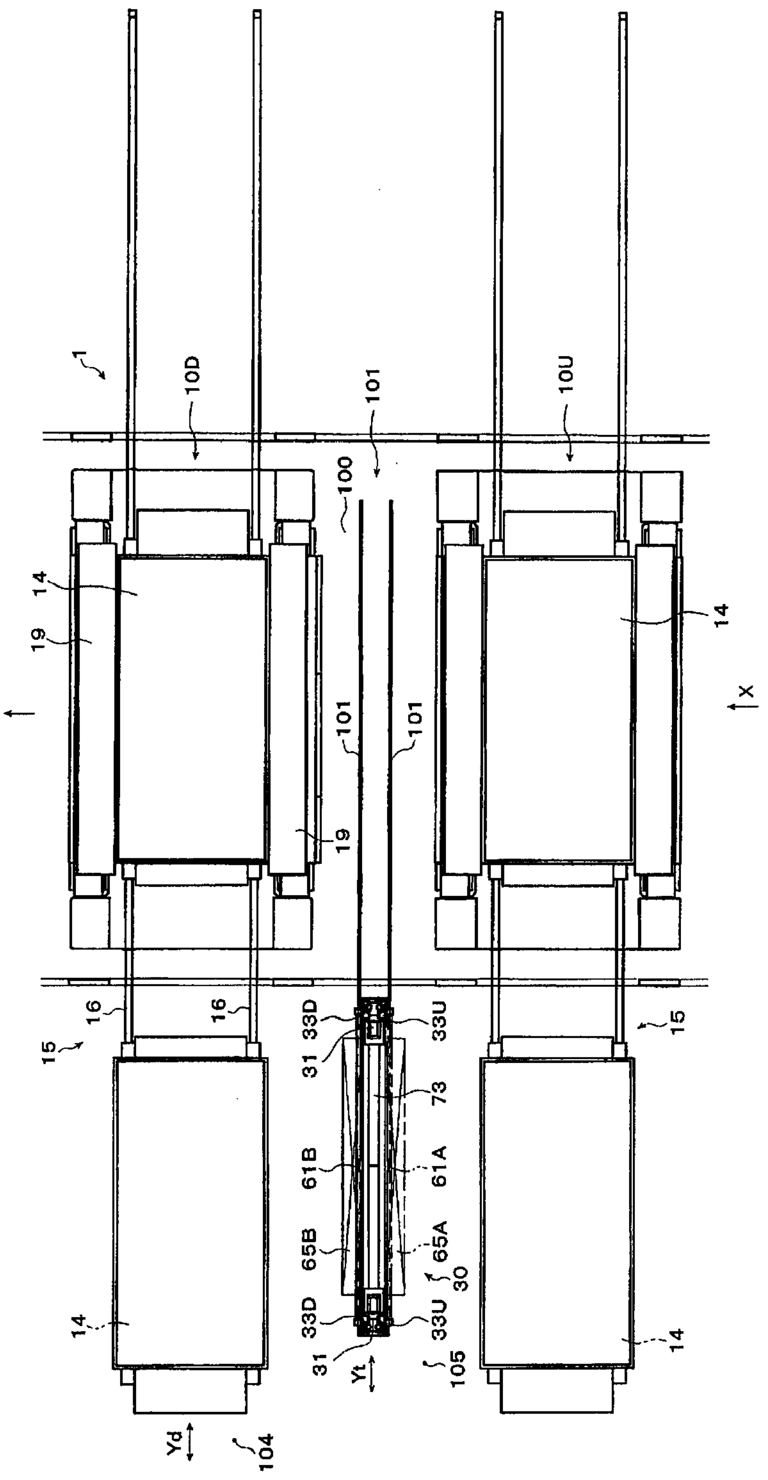
FIG. 1 is a plan view illustrating a tandem press system according to one embodiment of the invention.

The invention may provide a tool replacement method for a tandem press system and a tandem press system that allow quick tool replacement, and achieve high productivity.

A tool replacement operation is performed during a press suspension period. A tool replacement operation in an external space can be accurately and safely performed when the operator need not hurry to perform the operation. Moreover, a mental and physical burden on the operator can be reduced when the operator need not hurry to perform the operation. A press operation can be quickly restarted if the crossbar of the workpiece transfer device can be quickly replaced with another crossbar. This makes it possible to improve productivity.

The invention was conceived in view of the above technical situation of the tandem press system, and aims at increasing the tool replacement time in the external space while reducing the tool replacement time in the inter-press space.

Specifically, the invention aims at ensuring that the subsequent crossbar (subsequent tool) can be easily provided in the external space during the press operation, reception of the current crossbar and delivery of the subsequent crossbar can be sequentially performed in the inter-press space, and the current crossbar and the subsequent crossbar can be transferred between the external space and the inter-press space by causing the tool replacement device to make only one round trip. Productivity can be maximized by implementing a quick tool replacement operation.

According to one embodiment of the invention, there is provided a tool replacement method for a tandem press system that is configured so that a workpiece can be transferred from an upstream press to a downstream press disposed in a the workpiece transfer direction using a workpiece transfer device, and a tool mounted on the workpiece transfer device can be replaced using a tool replacement device, the method including:

mounting a subsequent crossbar mounted with a subsequent tool on one of receiving sections of the tool replacement device in an external space in a tool replacement direction that perpendicularly intersects the workpiece transfer direction;

transferring the tool replacement device mounted with the subsequent crossbar from the external space to an inter-press space between the upstream press and the downstream press during a press suspension period;

delivering a current crossbar mounted with a current tool from the workpiece transfer device to empty one of the receiving sections of the tool replacement device in the inter-press space;

delivering the subsequent crossbar mounted on the one of the receiving sections to the workpiece transfer device; and transferring the tool replacement device mounted with the current crossbar delivered from the workpiece transfer device to the external space to complete a replacement operation of the tool mounted on the workpiece transfer device.

The above tool replacement method allows quick tool replacement, and significantly improves productivity.

According to another embodiment of the invention, there is provided a tandem press system including:

a plurality of presses disposed in a workpiece transfer direction;

a workpiece transfer device that transfers a workpiece from an upstream press to a downstream press using a tool mounted on the workpiece transfer device via a crossbar; and a tool replacement device that replaces the tool mounted on the workpiece transfer device, wherein the tool replacement device can be transferred from an inter-press space between the upstream press and the downstream press to an external space in a tool replacement direction that perpendicularly intersects the workpiece transfer direction independently of transfer of a bolster provided with a die to an external space in a die replacement direction that perpendicularly intersects the workpiece transfer direction;

wherein two receiving sections disposed in parallel in the workpiece transfer direction are provided in a crossbar mounting section of the tool replacement device, and two crossbars can be respectively mounted on the two receiving sections at the same time;

wherein a current crossbar mounted with a current tool can be delivered from the workpiece transfer device to empty one of the receiving sections of the tool replacement device in the inter-press space during a press suspension period, and a subsequent crossbar mounted with a subsequent tool can be delivered to the workpiece transfer device from one of the receiving sections of the tool replacement device; and wherein the tool replacement device that has received the current crossbar can be transferred to the external space in the tool replacement direction, and the current crossbar can be removed from one of the receiving sections in the external space, and the subsequent crossbar can be mounted on the other of the receiving sections.

The above tandem press system makes it possible to smoothly implement the above tool replacement method, and can be easily implemented and easily operated.

The tandem press system may include an automatic mounting position switch control section that positions a coupling/holding section of the workpiece transfer device on the empty one of the receiving sections when delivering the current crossbar, and positions the coupling/holding section on one of the receiving sections mounted with the subsequent crossbar when receiving the subsequent crossbar.

This makes it possible to implement more accurate reception and delivery.

In the above tandem press system, the crossbar mounting section of the tool replacement device may vertically move to follow a change in vertical position of the workpiece transfer device when mounting the crossbar.

This makes it possible to mount the crossbar on the crossbar mounting section without causing a shock.

In the above tandem press system, the workpiece transfer device may be supported on a base either directly or indirectly via a vibration-proof device that can change in vertical position.

This makes it possible for the crossbar mounting section to reliably follow a change in vertical position of the workpiece transfer device.

In the above tandem press system, the tool replacement device may include the crossbar mounting section, a truck that can travel along a travel rail that extends in the tool replacement direction, a connection member that connects the crossbar mounting section to the truck, and a travel driver section, and the crossbar mounting section may move upward and downward with respect to the truck.

This makes it possible for the operator to easily perform the tool replacement operation in the external space.

In the above tandem press system, the crossbar mounting section may be positioned at a low position employed when the truck travels, a middle position employed when replacing the tool in the external space, and a high position employed when delivering the crossbar in the inter-press space.

This makes it possible to further stabilize travel of the truck and delivery of the crossbar.

In the above tandem press system, the truck and the travel driver section may be disposed under a floorboard member, a pair of cut sections that have a small dimension in the workpiece transfer direction and extend in the tool replacement direction may be formed in the floorboard member, and the connection member may be formed by two or more plate-like members that can move through the cut section in the tool replacement direction.

This makes it possible to deal with a case where the inter-press distance is small, and easily dispose of scraps.

Embodiments of the invention are described in detail below with reference to the drawings.

As illustrated in FIGS. 1 to 6, a tandem press system 1 is configured so that a tool replacement device 30 can be transferred from an inter-press space 11 to an external space 105 in a tool replacement direction (direction Yt) that perpendicularly intersects a workpiece transfer direction (direction X) independently of transfer of a bolster 14 provided with a die to an external space 104 in a die replacement direction (direction Yd) that perpendicularly intersects the direction X, two receiving sections 33D and 33U disposed in parallel in the direction X are provided in a crossbar mounting section 31 of the tool replacement device 30, two crossbars 61 (61B and 61A) can be mounted on the crossbar mounting section 31 at the same time, a current crossbar 61 B can be delivered from a workpiece transfer device 20 to one (empty) receiving section 33D (33U) of the tool replacement device 30 in the inter-press space 11 during a press suspension period, a subsequent crossbar 61A mounted on the other receiving section 33U (33D) can be delivered to the workpiece transfer device 20, the tool replacement device 30 that has received the current crossbar 61B can be transferred to the external space 105, the current crossbar 61B can be removed from one receiving section 33D (33U), and the subsequent crossbar 61A can be mounted on the other receiving section 33U (33D).

Specifically, the tandem press system 1 basically corresponds to the tandem press system according to the second aspect of the invention, and is suitable for implementing the tool replacement method according to the first aspect of the invention. Note that the current crossbar 61B is delivered to empty one of the receiving sections 33D and 33U (i.e., receiving section 33D or 33U), and the subsequent crossbar 61 may be mounted on either of the receiving sections 33D and 33U in the external space 105 after the current crossbar 61B has been removed. The receiving section on which the subsequent crossbar 61 is mounted may be selected taking account of the layout of the tool replacement instruments in the external space 105 and the working efficiency. An example in which the current crossbar 61B is delivered to the receiving section 33D, and the subsequent crossbar 61A is mounted on the other receiving section 33U is described below for convenience of illustration.

Figure 2A:
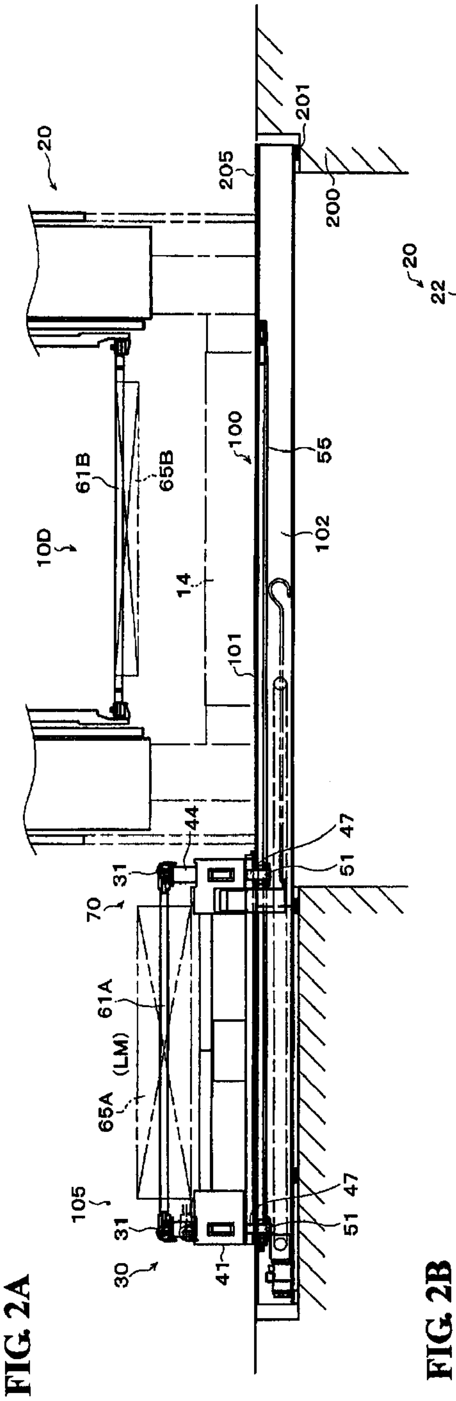
FIGS. 2A and 2B are side views illustrating the relationship between a downstream press, a workpiece transfer device, and a tool replacement device (viewed from the upstream side in the direction Y in FIG. 1).
Figure 2B:
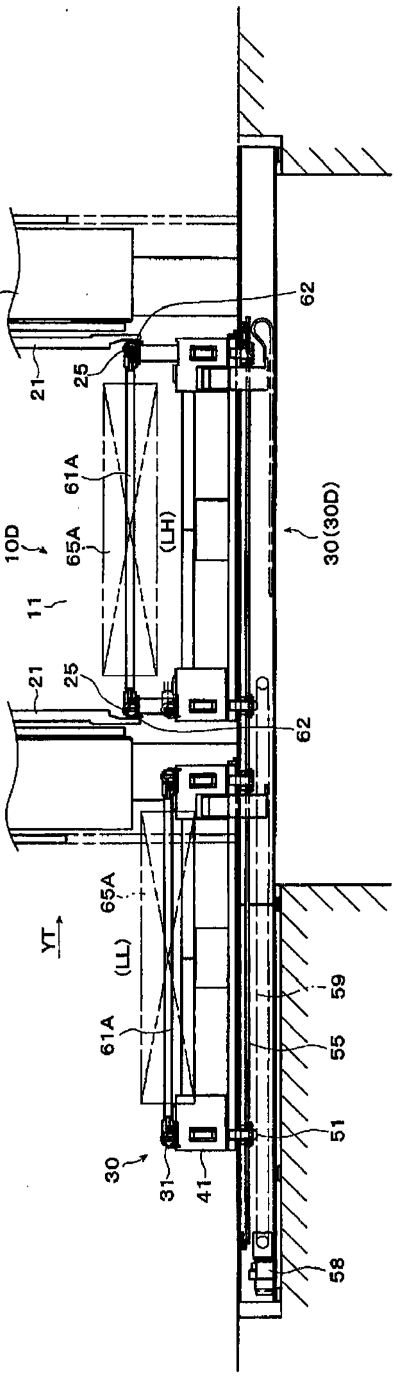

As illustrated in FIG. 1 (plan view) and FIGS. 2A and 2B (side views), the tandem press system 1 includes a plurality of presses 10 disposed in the direction X, the workpiece transfer device 20 that transfers a workpiece (not shown) from an upstream press 10U to a downstream press 10D using a tool 65 mounted on the workpiece transfer device 20 via a crossbar 61, and the tool replacement device 30 that replaces the tool 65 (crossbar 61) mounted on the workpiece transfer device 20. The upstream press 10U is a press that is positioned on the upstream side in the direction X, and the downstream press 10D is a press that is positioned on the downstream side in the direction X and is adjacent to the upstream press 10U. The space between the upstream press 10U and the downstream press 10D is referred to as the inter-press space 11.

The tool replacement device 30 illustrated in FIG. 1 is provided corresponding to the downstream press 10D (30D). A tool replacement device 30 corresponding to the upstream press 10U (30U), a press 10 and a tool replacement device 30 positioned on the upstream side of the upstream press 10U, and a press 10 and a tool replacement device 30 positioned on the downstream side of the downstream press 10D are omitted in FIG. 1.

A bolster 14 of each press 10 can be transferred in a direction Yd by a die replacement device 15 that includes a rail 16 illustrated in FIG. 1, a truck (not shown), and the like, and can travel between the inside of the press and the external space 104. A current die that has been transferred from the press 10 can be replaced with a subsequent die in the external space 104. The die replacement operation must be carefully performed, and takes considerable time. Note that reference numeral 19 in FIG. 1 indicates a scrap shooter that is disposed on each side of the bolster 14 in the direction X.

The tool replacement device 30 (30D) illustrated in FIG. 1 has mounted the current crossbar 61B delivered from the workpiece transfer device 20 on the receiving sections 33D in the inter-press space 11 during a press suspension period, and has been transferred to the external space 105. The current tool 65B mounted on the current crossbar 61B is a unit that includes a plurality of vacuum suction cups, an attachment, an operation handle, and the like, and is illustrated as a space occupied by the tool (unit) 65B. The subsequent crossbar 61A (subsequent tool 65A) indicated by a broken line is mounted on the receiving sections 33U in the external space 105.

Specifically, a tool replacement operation that removes the current crossbar 61B from the tool replacement device 30 and mounts the subsequent crossbar 61A on the tool replacement device 30 can be easily performed at any time in the external space 105 during a press operation.

FIG. 2A (i.e., a side view from the upstream side in the direction X illustrated in FIG. 1) illustrates a state in which the subsequent crossbar 61A is mounted on a pair of crossbar mounting sections 31 (33U) (i.e., a state after the tool replacement operation). A press operation is performed inside the downstream press 10D. The left side of FIG. 2B illustrates a state in which the tool replacement device 30 mounted with the subsequent crossbar 61A is transferred to the inter-press space 11 in the direction Yt. The right side of FIG. 2B illustrates a state in which the subsequent crossbar 61A is delivered to the workpiece transfer device 20 from the tool replacement device 30.

The workpiece transfer device 20 illustrated in FIGS. 2A and 2B is a means that holds and transfers the workpiece (not shown) from the upstream press 10U to the downstream press 10D. The transfer method and the structure of the workpiece transfer device 20 are not limited. The workpiece transfer device 20 according to this embodiment includes a transfer member (not shown) that can swing around a support shaft provided at the center area of the inter-press (10D and 10U) space 11, a feeder arm 21 that is attached to the transfer member so that the feeder arm 21 can move vertically, and a coupling/holding section 25 that is attached to the lower end of the feeder arm 21, and is configured so that the workpiece delivered from the upstream press 10U (bolster 14 (current die)) via the crossbar 61 (tool 65) can be transferred to (placed in) the downstream press 10D (bolster 14 (current die)).

The workpiece transfer device 20 is configured so that the current crossbar 61B (current tool 6513) can be delivered to the tool replacement device 30 via the coupling/holding section 25, and the subsequent crossbar 61A (subsequent tool 65A) can then be received from the tool replacement device 30. The coupling/holding section 25 has an automatic tool changer function, and can be connected to a connection section 62 of the crossbar (61), and completely hold the crossbar 61 in a connected state. An air piping system and an electrical system of the workpiece transfer device 20 can be automatically connected to the tool 65 mounted on the crossbar 61 in a connected state.

A workpiece transfer control section includes a servomotor control device (not shown), and transfers the workpiece held by the tool 65 from the upstream press 10U to the downstream press 10D while swinging the transfer member. The feeder arm 21 is vertical driven by a feeder driver device 22. The feeder arm 21 and the coupling/holding section 25 can horizontally maintain the crossbar 61 when receiving the workpiece from the upstream press 10U and when delivering the workpiece to the downstream press 10D. Specifically, the workpiece can be transferred in an identical posture.

Figure 4:
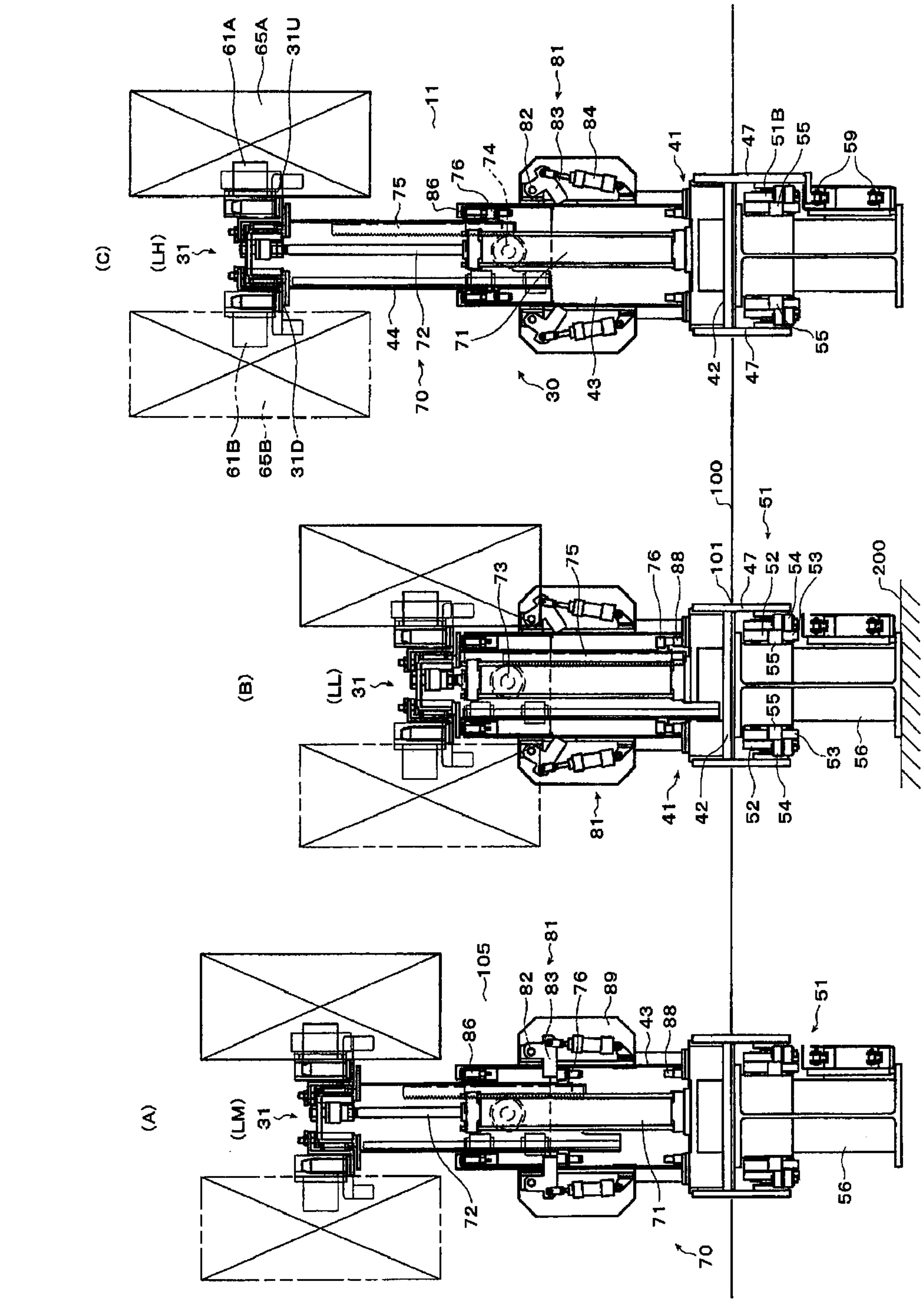
FIG. 4 is a partial cross-sectional front view illustrating the vertical position of a crossbar mounting section with respect to a truck ((A): middle position, (B): low position, (C): high position).

As illustrated in FIGS. 2A, 2B, and 4, the tool replacement device 30 (30U) includes the pair of crossbar mounting sections 31 attached to a device main body 41, the truck 51, a connection member 47 that connects the crossbar mounting section 31 (device main body 41) to the truck 51, and a travel driver section 58, and is configured so that the current crossbar 61B (current tool 65B) mounted on the workpiece transfer device 20 can be replaced.

The device main body 41 has a structure in which a cylindrical stationary section 43 is provided upright on a base 42 illustrated (C) of FIG. 4, and a movable section 44 is fitted into the stationary section 43 so that the movable section 44 can move vertically. This structure facilitates introduction of a lift section 70 (described in detail late).

The truck 51 includes a truck main body 51B illustrated in (C) of FIG. 4, and has a structure in which an upper roller 52, a lower roller 53, and a side roller 54 illustrated in (B) of FIG. 4 rotatably engage a travel rail 55. The truck 51 is integrally connected to the device main body 41 via the pair of connection members 47.

The truck 51 can travel along the travel rail 55 that extends in the direction Yt illustrated in FIG. 1. The travel rail 55 is supported by a base 200 via a rail rack 56 illustrated in (B) of FIG. 4. The travel driver section 58 includes a motor, a sprocket, a chain 59, and the like, and can drive the truck 51 (receiving section 33) in the direction Yt, and hold the truck 51 at a given position in the external space 105 and the inter-press space 11.

As illustrated in FIGS. 2A, 2B, and 4, the truck 51 and the travel driver section 58 are disposed under a floorboard member 100 (in a basement 102). A pair of cut sections 101 (see FIG. 1) that have a small dimension (e.g., 30 mm) the direction X and extend the direction Yt is formed in parallel in the floorboard member 100. The connection members 47 are formed by two or more plate-like members having a dimension (thickness) slightly smaller than the width of the cut section 101 so that the pair of connection members 47 can smoothly move through the cut sections 101 in the direction Yt in a sealed state. Specifically, two plate-like members (47) are provided in the direction X, and one or two or more plate-like members (47) are provided in the direction Yt.

According to the above configuration, when providing some (e.g., travel rail 55 and track 51) of the elements of the tool replacement device 30 under the floor (i.e., in the basement 102) (see FIGS. 2A and 2B), it is unnecessary to provide an access cover (e.g., a trench cover of the related-art example 2) (i.e., refuse/scrap scattering preventive measures and safety measures) in the top opening of the basement 102. This makes it unnecessary to open a heavy access cover before the tool replacement operation, and then close the access cover. Therefore, the operation time can be reduced while improving productivity. Moreover, production of a large noise due to opening and closing of the cover, and a burden on the operator can be avoided.

The tool replacement device 30 can be transferred from the inter-press space 11 illustrated in FIG. 1 to the external space 105 in the direction Yd independently of transfer of the bolster 14 of the press 10 in the direction Yd (to the external space 104). Specifically, the tool and the die can be independently replaced. This makes it possible to prevent a time delay due to a time-series operation and operation complexity (refer to the related-art example 1).

As illustrated in FIGS. 1, 3A, 3B, and 5, a pair of (two) receiving sections 33 (33U (upstream side in the direction X) and 33D (downstream side in the direction X)) is disposed in parallel in each crossbar mounting section 31 of the tool replacement device 30 in the direction X so that two crossbars 61B and 61A can be mounted at the same time.

The workpiece transfer device 20 and the tool replacement device 30 are configured so that the current crossbar 61B removed (delivered) from the workpiece transfer device 20 in the inter-press space can be received by the receiving sections 33D, and the subsequent crossbar 61A mounted on the receiving sections 33U can be delivered to the workpiece transfer device 20. Note that the subsequent crossbar 61A has been mounted on the receiving sections 33U in the external space 105.

An automatic mounting position switch control section (not shown) is provided so that the current crossbar can be accurately and promptly replaced with the subsequent crossbar by a fully automatic operation. The automatic mounting position switch control section is controlled based on a program in the same manner as the workpiece transfer control section. The automatic mounting position switch control section controls the mounting position so that the coupling/holding section 25 of the workpiece transfer device 20 can be positioned on the receiving section 33D when delivering the current crossbar 61B, and can be positioned on the receiving section 33U when receiving the subsequent crossbar 61A. A subsequent crossbar receiving section designation switch is provided, and the automatic mounting position switch control section can perform automatic switch control based on information designated using the subsequent crossbar receiving section designation switch, so that the subsequent crossbar 61 can be selectively mounted on one of the receiving sections 33D and 33U.

Accordingly, the crossbars 61 can be replaced by causing the tool replacement device 30 to make a round trip between the inter-press space 11 and the external space 105. Moreover, the subsequent crossbar 61A (subsequent tool 65A) can be mounted in advance on the crossbar mounting section 31 (receiving section 33U) in the external space 105 during a press operation before the current crossbar 61B (current tool 65B) is transferred to the external space 105). This makes it possible to solve the problems (i.e., an increase in tool replacement time due to two round trips and difficulty in operation) of the related-art example 2.

The lift section 70 is a means that vertically moves the crossbar mounting section 31 with respect to the truck 51, and allows the operator to perform the tool replacement operation in the external space 105 in a comfortable position. The lift section 70 according to this embodiment can position the crossbar mounting section 31 at a low position (LL) employed when the truck travels, a middle position (LM) employed when replacing the tool, and a high position (LH) employed when delivering the crossbar (see FIGS. 2A, 2B, and 4).

As illustrated in FIG. 4, the lift section 70 includes a lift cylinder device (lift cylinder 71 and piston 72), and an intermediate positioning section 81. Specifically, the lift cylinder device employs a simple two-stage positioning structure, and three-stage positioning can be accurately implemented by combining the intermediate positioning section 81 with the lift cylinder device. Note that the lift section 70 may be formed to implement multi-stage switching or positioning using a servomotor control method, for example.

The lift cylinder 71 is disposed in the device main body 41 (stationary section 13), and the end of the piston 72 is connected to the crossbar mounting section 31. Pinions 74 that respectively engage racks 75 respectively attached to the right and left movable sections 44 (in the direction Yt) are connected via a synchronous shaft 73 that extends in the direction Yt. This makes it possible to vertically move the right and left crossbar mounting sections 31 in synchronization while maintaining the crossbar mounting sections 31 at an identical height. The crossbar mounting sections 31 can be stably held at the adjusted position by stopping the rotation of the synchronous shaft 73 using a brake 77.

(B) of FIG. 4 illustrates a state in which the crossbar mounting section 31 is moved downward to the low position (LL), and an engagement piece 76 attached to the lower end of the rack 73 comes in contact with a low-position stopper 88 in the stationary section (43). The low position (LL is a position where the center of gravity of the tool replacement device 30 is lowered so that the speed and smoothness of travel can be improved. The low position (LL) is selected as a position where interference with other devices and instruments disposed between the inter-press spaces 11 and the external space 105 can be avoided. The structure of the entire truck including the engagement mechanism of the travel rail 55 and the truck Si can be simplified by setting the position (LL) as low as possible. Moreover, since the center of gravity can be lowered, the travel stability can be improved.

(C) of FIG. 4 illustrates a state in which the crossbar mounting section 31 is moved upward to the high position (LH), and the engagement piece 76 comes in contact with a high-position stopper 86 in the stationary section (43). Since the workpiece transfer device 20 is selected (configured) based on the relationship with the configuration and the operation of the press 10 (including the die positioned on the bolster 14), it is difficult to change the structure and the functions of the workpiece transfer device 20 for facilitating the tool replacement operation.

The high position (LH) is selected as a position where quick and smooth reception and delivery of the crossbar 61 between the tool replacement device 30 (31) and the workpiece transfer device 20 can be implemented in the inter-press space (11) without changing the structure and the functions of the workpiece transfer device 20. The vertical stroke of the feeder arm 21 (coupling/holding section 25) can be reduced by setting the position (LH) as high as possible within an allowable range. Therefore, the productivity can be improved, as a result of reducing the cost of the workpiece transfer device 20 and the vertical movement time.

When transferring the tool replacement device 30 (31) set at the high position (LH) to the external space 105, it is necessary to design the tool replacement device 30 (particularly the truck 51) to have a more rigid structure, and change the structure and the functions of the peripheral devices and instruments in order to avoid interference (refer to the related-art example 2). It is disadvantageous for the workpiece transfer device (20) to receive the crossbar 61 from the workpiece transfer device 20 in a state in which the tool replacement device 30 (31) is set at the low position (LL) shown in (B) of FIG. 4.

Since a related-art tool replacement device (e.g., related-art example 2) has a fixed structure in which one position is selected depending on the press system, it has been impossible to optimize the reception/delivery characteristics with respect to the workpiece transfer device 20 and the transfer (travel) characteristics of the tool replacement device 30 at the same time. In many cases, as low a position as possible has been selected in order to avoid interference with the peripheral devices and simplify the structure of a truck, for example.

However, this selection standard is mainly based on the standpoint of the manufacturer, and does not sufficiently take convenience to the actual user of the device into account. A related-art tool replacement device may generally impose a considerable burden on the operator who performs the tool replacement operation in the external space 105. Specifically, the operator must improperly stoop when the working position is too low. This also applies to the case where the working position is too high. In particular, when removing the current tool 65B from the current crossbar 61B mounted on the crossbar mounting section 31, and then mounting the subsequent tool 65A on the current crossbar 61B (i.e., subsequent crossbar 61A), a burden on the operator significantly increases as compared with the case of replacing the current crossbar MB (current tool 65B) with the subsequent crossbar 61A (subsequent tool 65A).

The production efficiency can be improved while reducing cost by setting the external space replacement position so that the operator can easily and quickly perform the tool replacement operation. Therefore, the middle position (LM) shown in (A) of FIG. 4 is provided for the tool replacement operation. The middle position (LM) allows accurate positioning while simplifying the structure and the functions of the lift section 70 due to introduction of the intermediate positioning section 81.

The intermediate positioning section 81 includes an L-shaped middle position stopper 83 that can be rotated around a fulcrum shaft 82 implanted in a bracket 89, and link cylinder 84. The middle position stopper 83 is set in a horizontal state (see (A) of FIG. 4) before or after the vertical movement of the lift section 70 occurs, so that the engagement piece 76 that is integrally formed with the movable section 44 (rack 75) engages (is locked by) the middle position stopper 83 (i.e., the middle position (LM) is achieved). The middle position (LM) can easily be set to an ideal position by changing the vertical position of the bracket 89 with respect to the stationary section 43.

It is necessary to accurately move the feeder arm 21 (coupling/holding section 25) vertically by a given amount when delivering the current crossbar 61B from the workpiece transfer device 20 to the tool replacement device 30, or when receiving the subsequent crossbar 61A from the tool replacement device 30. Therefore, workpiece transfer by the workpiece transfer device 20 (e.g., vertical movement control of the feeder arm 21) is preferably controlled by fixed amount positioning control (i.e., positioning control based on a pulse signal corresponding to the moving distance) as compared with post-detection positioning control (i.e., a motor is stopped on condition that a limit switch has detected the target position). Fixed amount positioning control ensures high positioning accuracy, and requires a simple configuration.

However, the relative positions of the tool replacement device 30 and the workpiece transfer device 20 in the vertical direction may change. Such a change may occur due to the mechanical structure, a change in load, thermal deformation, or the like. The relative positions of the tool replacement device 30 and the workpiece transfer device 20 in the vertical direction may also change when the workpiece transfer device 20 is directly provided on the base 200 via a dedicated vibration-proof device.

As illustrated in FIGS. 2A and 2B, when each press 10 (base 205) is provided on the base 200 via a vibration-proof device (e.g., vibration-proof rubber) 201 that can be displaced in the vertical direction, and the workpiece transfer device 20 is provided on a frame of the press 10 or the base 205 (i.e., the workpiece transfer device 20 is indirectly provided on the base 200 via the vibration-proof device 201), the relative positions of the tool replacement device 30 and the workpiece transfer device 20 in the vertical direction may change to a large extent. Specifically, even if the structure and the weight of the press 10 and the structure and the weight of the workpiece transfer device 20 are identical, the relative vertical position of the workpiece transfer device 20 (25) with respect to the tool replacement device 30 may change depending on the type of die and the type of tool. In this case, impact and noise may occur, or deformation or breakage of equipment may occur when delivering the current crossbar 61B from the workpiece transfer device 20 to the tool replacement device 30.

The above problem must be solved particularly for a press system that is used to produce a wide variety of products in small quantities for which the die is frequently replaced. In order to deal with this problem, a floating section 90 is provided, as a means that absorbs a change in the relative positions of the tool replacement device 30 (crossbar mounting section 31) and the workpiece transfer device 20 (coupling/holding section 25) in the vertical direction, so that the crossbar mounting section 31 (33) automatically follows (i.e., vertically moves) a change in vertical position of the workpiece transfer device 20 (feeder arm 21) when the crossbar is mounted on the crossbar mounting section 31.

Figure 5:
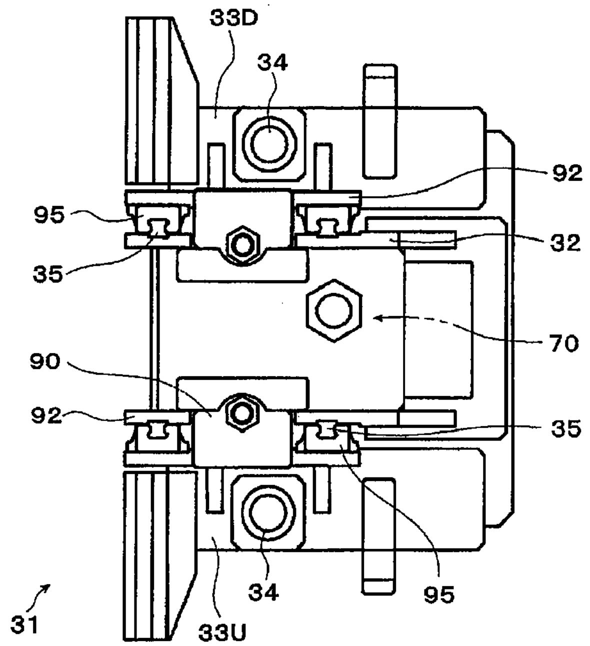
FIG. 5 is a plan view illustrating a receiving section and a floating section.
Figure 6:
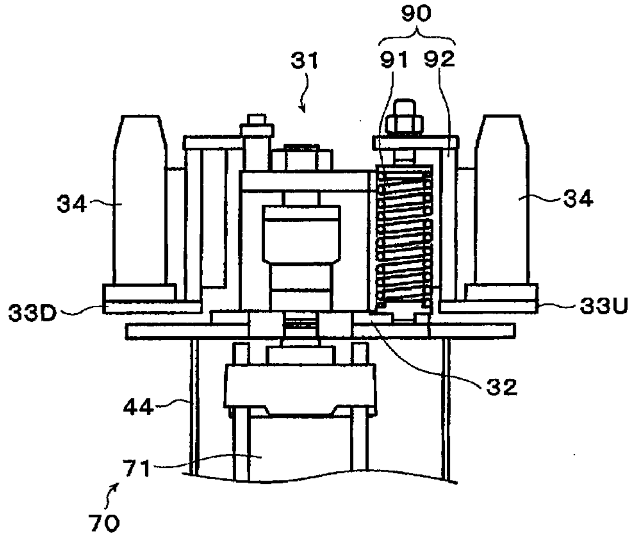
FIG. 6 is a front view illustrating a receiving section and a floating section.

As illustrated in FIGS. 5 and 6, the floating section 90 includes a spring 91, a bracket 92, and a linear guide (stationary linear guide 35 and movable linear guide 95). The L-shaped bracket 92 is mounted on a mounting section main body 32 via the linear guide so that the bracket 92 can move in the vertical direction in FIG. 6. The receiving sections 33D and 33U are attached to the bracket 92, and biased upward by the spring 91. Specifically, the receiving sections 33D and 33U can be retained in a floating state.

The resilient force of the spring 91 is selected, so that the current crossbar MB can be delivered to the tool replacement device 30 (receiving section 33D) in each of the following cases without causing a shock. For example, when the weight of the die is a maximum, and a change in vertical position is a maximum (e.g., 2 to 5 mm), the resilient force of the spring 91 is selected so that a maximum change in vertical position (2 to 5 mm) of the workpiece transfer device 20 (coupling/holding section 25) can be absorbed by the floating section 90. As illustrated in FIG. 6, the tool mounting section 31 (receiving section 33D) is held in a floating state with respect to the upper surface of the mounting section main body 32 even at the lowermost position. When the weight of the die is a minimum, and a change in vertical position is a minimum (or zero), the resilient force of the spring 91 is selected so that the current crossbar 61B held by the workpiece transfer device 20 (coupling/holding section 25) can be mounted on (caused to come in contact with) the receiving section 33D. Even if a change in vertical position is a minimum (or zero), the resilient force of the spring 91 may be selected so that the spring 91 is displaced (compressed) downward by a minimum amount.

Note that planar positioning with respect to the tool replacement device 30 (mounting section main body 32) is reliably achieved by inserting a position-restricting pin member 34 into a position-restricting hole (not shown) formed in the crossbar 61 during downward movement.

The tool replacement method is implemented as follows using the tandem press system 1.

During Press Operation

Each press 10 performs a press operation corresponding to the current die. After completion of the press operation, the workpiece transfer device 20 illustrated in FIGS. 2A and 2B transfers the workpiece held using the current tool 65A (current crossbar 61A) from the upstream press 10U to the downstream press 10D. The above press operation and workpiece transfer operation are repeatedly performed. The dimension of the cut section 101 formed in the floorboard member 100 in the direction X is selected to be a minimum so that the narrow connection member 48 illustrated in FIG. 4 can pass through, and the truck 51 can travel smoothly. Therefore, scraps produced by the press operation do not enter the space under the floor. The tool replacement device 30 is positioned in the external space 105 illustrated in FIGS. 1 and 2A during the press operation. The crossbar mounting section 31 (33D, 33U) is raised to the middle position (LM) illustrated in FIG. 2A and (A) of FIG. 4 by actuating the lift section 70 and the intermediate positioning section 81 in the external space 105.

Preparation of Subsequent Tool

The operator mounts the subsequent crossbar 61A (subsequent tool 65A) on the receiving sections 33U (see FIG. 3A) of the tool replacement device 30 in the external space 105 during the press operation. Specifically, the subsequent tool 65A is provided in advance. The operator removes the current crossbar 61B (current tool 65B) (i.e., the current crossbar 61 used for the preceding press step (former current crossbar 61)) from the receiving sections 33D before or after the above operation. The tool replacement operation in the external space 105 is thus completed. Note that the tool replacement operation in the external space 105 may be performed by removing the current tool 65B from the current crossbar MB mounted on the receiving sections 33D, mounting the current crossbar 61B on the receiving sections 33U, and mounting the subsequent tool 65A on the current crossbar 61B (i.e., subsequent crossbar 61A). In either case, since the crossbar mounting section 31 (33D, 33U) is positioned at the ideal middle position (LM) illustrated in FIG. 2A and (A) of FIG. 4, the operator can easily and efficiently perform the operation. Since the operator need not hurry to perform the operation, the operator can accurately and safely perform the operation. Moreover, a mistake (e.g., a tool mistake) can be prevented. After completion of the operation, the crossbar mounting section 31 (33D, 33U) is moved downward from the middle position (LM) (see (A) of FIG. 4) to the low position (LL) (see (B) of FIG. 4) by releasing the intermediate positioning section 81 (middle position stopper 83), and moving the lift section 70 downward. Therefore, the tool replacement device 30 can be transferred to the inter-press space 11 at any time.

Suspension of Press Operation

When a press operation suspension instruction has been issued, the workpiece transfer device 20 is stopped in the inter-press space 11. The workpiece transfer device 20 holds the current crossbar 61B (see FIG. 2A). In this embodiment, when moving the feeder arm 21 downward, the coupling/holding sections 25 are positioned corresponding to the receiving sections 33D of the tool replacement device 30 that will be transferred to the inter-press space 11. The die positioned on the bolster 14 can be transferred to the external space 104 by moving the die replacement device 15 in the direction Yd (see FIG. 1) after the press operation has stopped.

Transfer of Tool Replacement Device

When a tool replacement request has been issued, the tool replacement device 30 mounted with the subsequent crossbar 61A is transferred from the external space 105 to the inter-press space 11 in the direction Yt in a state in which the low position (LL) is maintained (see the left side of FIG. 2B) during the press suspension period. The right side of FIG. 2B illustrates a state in which the tool replacement device 30 has been transferred to the inter-press space 11. The crossbar 61A can be transferred independently of transfer of the die. The crossbar 61B is also transferred independently of transfer of the die.

Delivery of Current Tool

The lift section 70 is actuated in the nter-press space 11 so that the crossbar mounting section 31 (33D, 33U) is raised to the high position (LH) (see (C) of FIG. 4) from the low position (LL) (see (B) of FIG. 4). Specifically, a transition from the state illustrated on the right side of FIG. 3B to the state illustrated on the left side of FIG. 3B occurs. The workpiece transfer device 20 (feeder arm 21) is lowered by actuating the feeder driver device 22, so that the current crossbar MB approaches the tool replacement device 30 (receiving sections 33D). In this case, even if the workpiece transfer device 20 has moved downward due to shrinkage of the vibration-proof device caused by the weight of the die, the crossbar mounting section 31 (33D, 33U) is held in a floating state due to the floating section 90 (spring 91) illustrated in FIG. 6. This makes is possible to implement shockless mounting. An automatic tool changer (coupling/holding section 25) is then actuated to release connection with the connection section 62. The current crossbar MB (current tool 65B) can thus be delivered to the tool replacement device 30. The planar position is accurately restricted by the position-restricting pin member 34. The tool replacement device 30 thus receives the current crossbar 61B (current tool 65B). The feeder arm 21 in an empty state is moved upward to the given position.

Reception of Subsequent Tool

The workpiece transfer device 20 (feeder arm 21) is lowered by actuating the feeder driver device 22. The transfer member slightly swings due to the automatic mounting position switch control section, and the mounting position is changed so that the coupling/holding section 25 corresponds to the receiving sections 33U. Therefore, the feeder arm 21 (coupling/holding section 25) in an empty state approaches the tool replacement device 30 (33U). In this case, since the crossbar mounting section 31 (33U) is held in a floating state at a downward position corresponding to the amount of shrinkage due to the floating section 90 (spring 91), the subsequent crossbar 61A (the subsequent tool 65A) can be accurately positioned. The automatic tool changer (coupling/holding section 25) is then actuated to achieve connection with the connection section 62. The subsequent crossbar 61A (subsequent tool 65A) can thus be delivered from the tool replacement device 30 to the workpiece transfer device 20. Specifically, the workpiece transfer device 20 can receive the subsequent crossbar 61A (subsequent tool 65A) from the tool replacement device 30. The feeder arm 21 is then moved upward to the given position. The crossbar 61 of the workpiece transfer device 20 is replaced in this manner. The press operation can be restarted by utilizing the subsequent crossbar 61A (subsequent tool 65A) as the current crossbar 61B (current tool 65B).

Transfer of Tool Replacement Device

After delivering the subsequent crossbar 61A (subsequent tool 65A), the lift section 70 is actuated so that the crossbar mounting section 31 (33D, 33U) is lowered to the low position (LL) (see (B) of FIG. 4) from the high position (LH) (see (C) of FIG. 4). Specifically, a transition from the state illustrated on the side left of FIG. 3B to the state illustrated on the right side of FIG. 3B occurs. The tool replacement device 30 mounted with the current crossbar 61B (former current crossbar 61) is then transferred to the external space 105 in the direction Yt opposite to the direction (→) illustrated in FIG. 2B. The tool replacement device 30 can be transferred independently of the die replacement device 15.

Tool Replacement Operation in External Space

Figure 3A:
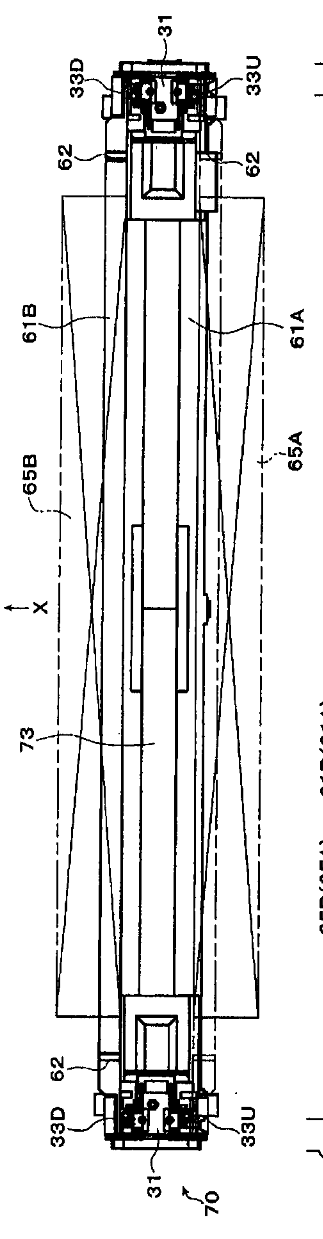
FIGS. 3A and 3B illustrate a lift section that mainly moves a crossbar mounting section upward and downward.
Figure 3B:
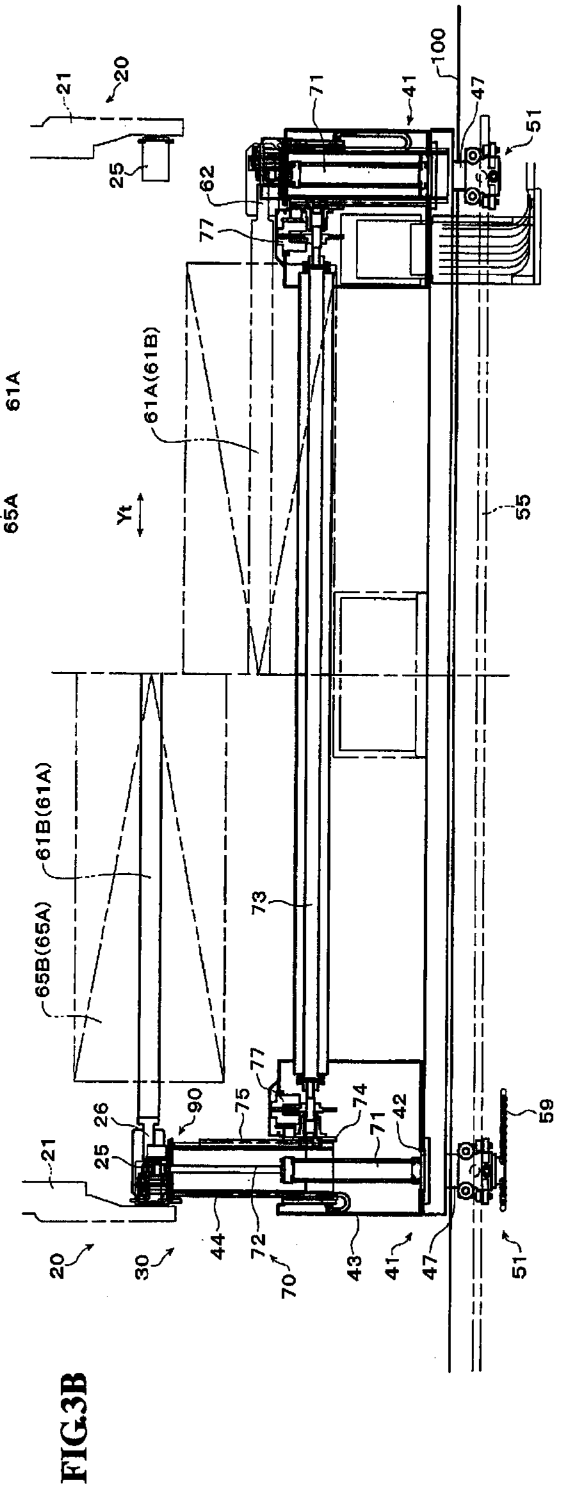

During a period until the crossbar of the workpiece transfer device 20 need to be replaced again, the operator removes the current crossbar 61B (current tool 65B) (i.e., former current crossbar 61 (current tool 65)) from the receiving sections 331) in the external space 105, and mounts the subsequent crossbar 61A (subsequent tool 65A) (i.e., the subsequent crossbar 61A (subsequent tool 65A) that will be used as the current crossbar in the subsequent press operation) on the receiving section 33U of the tool replacement device 30 (see FIG. 3A). Specifically, a tool (subsequent tool 65A) that is used for the subsequent press operation can be provided in advance.

Transfer of Die Replacement Device

When the press operation has been suspended, and a die replacement request has been issued, the die replacement device 15 is moved in the direction Yd illustrated in FIG. 1, so that the bolster 14 (die) is transferred from the press (10) to the external space 104. This operation does not affect the transfer operation of the tool replacement device 30.

Die Replacement Operation in External Space

The current die set to the bolster 14 is removed in the external space 104, and replaced with the subsequent die. Since the die replacement position is separate from the tool replacement position, the die replacement operation does not cause the problems complexity and difficulty in the tool replacement operation) of the related-art example 1.

Transfer of Die Replacement Device

The bolster 14 provided with the subsequent die is transferred from the external space 104 to the press (10). The die replacement operation is thus completed. Since the tool replacement operation and the die replacement operation are not sequentially performed in time series, the press suspension period (time) including the tool replacement operation and the die replacement operation can be minimized. Therefore, the subsequent product can be quickly produced. Moreover, cost can be reduced as a result of reducing the operation time.

According to this embodiment, the subsequent crossbar 61A (65A) is mounted on the tool replacement device 30 (33U) in the external space 105, and the tool replacement device 30 is transferred from the external space 105 to the inter-press space 11 during the press suspension period. The current crossbar 61B (65B) is then delivered from the workpiece transfer device 20 to the tool replacement device 30 (33D), and the subsequent crossbar 61A (65A) is delivered to the workpiece transfer device 20. The tool replacement device 30 mounted with the current crossbar 61B (65B) is then transferred to the external space 105 to complete the tool replacement operation. Therefore, the tool of the tandem press system can be quickly replaced while significantly improving productivity. This particularly improves the productivity of a system used to produce a wide variety of products in small quantities, Moreover, the tool replacement device 30 can be transferred from the inter-press space to the external space 105 in the direction Yt independently of transfer of the die (bolster 14) to the external space 104 in the direction Yd, and two crossbars 61 (61B, 61A) can be mounted on the crossbar mounting section 31 (33D, 33U) of the tool replacement device 30 at the same time. The current crossbar 61B can be delivered from the workpiece transfer device 20 to the tool replacement device 30, and the subsequent crossbar 61A can be delivered from the tool replacement device 30 to the workpiece transfer device 20 during the press suspension period. When the tool replacement device 30 mounted with the current crossbar 61B has been transferred to the external space 105, the current crossbar 61B can be removed from the receiving section 33D, and the subsequent crossbar 61A can be mounted on the receiving section 33U. Therefore, a device that may smoothly implement the above tool replacement method can be provided. The device can be easily implemented, and easily operated.

Since the coupling/holding section can be positioned with the receiving section 33D when delivering the current crossbar 61B, and can be positioned with the receiving section 33U when receiving the current crossbar 61B by utilizing the automatic mounting position switch control section, the crossbars 61 can be delivered and received more accurately and quickly.

Since the crossbar mounting section 31 of the tool replacement device 30 follows a change in vertical position of the workpiece transfer device 20 when mounting the crossbar 61, the crossbar 61 can be mounted without causing a shock.

Since the workpiece transfer device 20 is supported by the base 200 via the vibration-proof device 201, it is possible for the crossbar mounting section 31 to follow a change in vertical position of the workpiece transfer device 20.

Since the tool replacement device 30 includes the crossbar mounting section 31, the truck 55, the connection member 47, and the travel driver section 58, and can move upward and downward with respect to the truck 55 (base 200), the operator can easily perform the tool replacement operation in the external space 105.

Since the crossbar mounting section 31 can be positioned at the low position when the truck travels, the middle position when replacing the tool, and the high position when delivering the crossbar, travel of the truck 55 and delivery of the crossbar 61 can be stabilized.

Since the truck 55 and the travel driver section 58 are disposed under the floorboard member 100, a pair of cut sections 101 that have a small dimension in the direction X and extend in the direction Yt is formed in the floorboard member 100, and the connection member 47 is formed of two or more plate-like members so that the connection member 47 can move through the cut section 101, it is possible to deal with a case where the inter-press distance is small, and easily dispose of scraps.

The device according to this embodiment allows easy access to the press in the same manner as the related-art example 1, and can deal with a system with a small inter-press pitch in the same manner as the related-art example 2. Since the die replacement operation and the tool replacement operation are not sequentially performed in time series (refer to related-art example 1), and the truck is not caused to make two round trips (refer to related-art example 2), the die replacement operation and the tool replacement operation can be quickly performed. Moreover, the operator can easily perform the tool replacement operation.

According to this embodiment, the press side space (side opening) can be increased as compared with the related-art example 2 while facilitating access to the press. According to this embodiment, the tool replacement operation is not hindered by the die replacement operation in the external space. Moreover, the tool can be replaced independently of the die.

According to this embodiment, the subsequent crossbar can be provided before transferring the current crossbar. Specifically, the operator can accurately and reliably perform the replacement operation since the operator need not hurry to perform the replacement operation. This significantly improves the productivity of the entire tandem press system, and makes it easy to produce a wide variety of products in small quantities for which the die is frequently replaced.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A tandem press system comprising:

a plurality of presses disposed in a workpiece transfer direction;

a workpiece transfer device that transfers a workpiece from an upstream press to a downstream press using a tool mounted on the workpiece transfer device via a crossbar; and a tool replacement device that replaces the tool mounted on the workpiece transfer device, wherein the tool replacement device can be transferred from an inter-press space between the upstream press and the downstream press to an external space in a tool replacement direction that perpendicularly intersects the workpiece transfer direction independently of transfer of a bolster provided with a die to an external space in a die replacement direction that perpendicularly intersects the workpiece transfer direction;

wherein two receiving sections disposed in parallel in the workpiece transfer direction are provided in a crossbar mounting section of the tool replacement device, and two crossbars can be respectively mounted on the two receiving sections at the same time;

wherein a current crossbar mounted with a current tool can be delivered from the workpiece transfer device to empty one of the receiving sections of the tool replacement device in the inter-press space during a press suspension period, and a subsequent crossbar mounted with a subsequent tool can be delivered to the workpiece transfer device from one of the receiving sections of the tool replacement device; and wherein the tool replacement device that has received the current crossbar can be transferred to the external space in the tool replacement direction, and the current crossbar can be removed from one of the receiving sections in the external space, and the subsequent crossbar can be mounted on the other of the receiving sections.

2. The tandem press system according to claim 1, further comprising an automatic mounting position switch control section that positions a coupling/holding section of the workpiece transfer device on the empty one of the receiving sections when delivering the current crossbar, and positions the coupling/holding section on one of the receiving sections mounted with the subsequent crossbar when receiving the subsequent crossbar.

3. The tandem press system according to claim 1, wherein the crossbar mounting section of the tool replacement device vertically moves to follow a change in vertical position of the workpiece transfer device when mounting the crossbar.

4. The tandem press system according to claim 3, wherein the workpiece transfer device is supported on a base either directly or indirectly via a vibration-proof device that can change in vertical position.

5. The tandem press system according to claim 1, wherein the tool replacement device includes the crossbar mounting section, a truck that can travel along a travel rail that extends in the tool replacement direction, a connection member that connects the crossbar mounting section to the truck, and a travel driver section, and the crossbar mounting section can move upward and downward with respect to the truck.

6. The tandem press system according to claim 5, wherein the crossbar mounting section can be positioned at a low position employed when the truck travels, a middle position employed when replacing the tool in the external space, and a high position employed when delivering the crossbar in the inter-press space.

7. The tandem press system according to claim 5, wherein the truck and the travel driver section are disposed under a floorboard member, a pair of cut sections that have a small dimension in the workpiece transfer direction and extend in the tool replacement direction is formed in the floorboard member, and the connection member is formed by two or more plate-like members that can move through the cut section in the tool replacement direction.

* * * * *